United States Patent [19]

Houston

[11] 4,159,916
[45] Jul. 3, 1979

[54] THERMAL MIGRATION OF FINE LINED CROSS-HATCHED PATTERNS

[75] Inventor: Douglas E. Houston, Ballston Lake, N.Y.

[73] Assignee: General Electric Company, Schenectady, N.Y.

[21] Appl. No.: 941,922

[22] Filed: Sep. 13, 1978

[51] Int. Cl.$^2$ .......................................... H01L 21/225
[52] U.S. Cl. ..................................... 148/1.5; 148/171; 148/178; 148/188
[58] Field of Search ................. 148/1.5, 171, 178, 188

[56] References Cited

U.S. PATENT DOCUMENTS

| | | | |
|---|---|---|---|
| 3,897,277 | 7/1975 | Blumenfeld | 148/1.5 |
| 3,899,361 | 8/1975 | Cline et al. | 148/171 X |
| 3,899,362 | 8/1975 | Cline et al. | 148/172 X |
| 3,902,925 | 9/1975 | Anthony et al. | 148/177 X |
| 3,904,442 | 9/1975 | Anthony et al. | 148/188 X |
| 3,998,662 | 12/1976 | Anthony et al. | 148/186 X |
| 4,006,040 | 1/1977 | Cline et al. | 148/187 X |

*Primary Examiner*—G. Ozaki
*Attorney, Agent, or Firm*—Donald M. Winegar; Joseph T. Cohen; Charles T. Watts

[57] ABSTRACT

Mutually perpendicular, intersecting, straight, fine molten wires, ($\leq 0.002''$ in width) can be migrated through a solid matrix body of semiconductor material of (100) planar orientation by migration along a unidirectional thermal gradient which is established and maintained at from 2° to 10° off the normally preferred <100> crystal axis of migration by the thermal gradient zone melting process. All the fine molten metal wires are substantially initiated simultaneously and uniformly along the entire length of each intersecting wire when the lines are arranged in a cross-hatched pattern.

5 Claims, No Drawings

THERMAL MIGRATION OF FINE LINED CROSS-HATCHED PATTERNS

BACKGROUND OF THE INVENTION

1. Field of the Invention

This invention relates to a method of migrating a melt of a metal through a solid body of semiconductor material by thermal gradient zone melting (TGZM) and, in particular, to the uniform initiation of migration by enhancing the penetration of melts into the material at the surface where fine liquid wires of an array are being migrated.

2. Description of the Prior Art

W. G. Pfann in U.S. Pat. Nos. 2,813,048 and 2,739,088 describes methods for practicing the moving of melts of metal through particular regions of a solid body of semiconductor material by thermal gradient zone melting. However, molten line and droplet instability resulted in the breakup of the migrating lines and droplets and consequently acceptable semiconductor devices were not always obtainable.

Recently, Thomas R. Anthony and Harvey E. Cline discovered that preferred planar orientations of the surfaces of the body of semiconductor material, migration axis and line orientation axes relationship were also a necessity to migrate liquid metal wires and/or droplets through the solid body (See U.S. Pat. Nos. 3,899,362 and 3,904,442, for example.) These improvements in TGZM resulted in commercialization of the process. However, as the width of the lines being migrated become smaller, the penetration of fine liquid lines of less than 2 mils in width, and preferably 1 mil in width, and small liquid droplets, less than 6 mils in diameter, from the surface of a wafer or body of semiconductor material has been difficult to achieve repeatedly on a commercial basis by a thermal gradient alone. Although a thermal gradient is strong enough to cause migration of the small liquid zones once they are formed in the bulk of semiconductor material, the thermal gradient force is not powerful enough to overcome the surface tension forces holding fine liquid zones, or wires, on the surface of a body, or wafer. Further improvements to the TGZM processing techniques included alloying the deposited metal to the surface (U.S. Pat. No. 3,897,277) and sintering of the same (U.S. Pat. No. 4,006,040). However, the problem still persists as one attempts to migrate fine wires on a commercial basis. As a result, TGZM to date has been limited to line dimensions typical of solid state power device isolation grids and has not had any commercial impact on integrated-circuit type devices which require a much finer size of doped region.

The attempt to migrate a cross-hatched pattern of fine aluminum lines ($\leq 0.002''$) in $<100>$ silicon results in the breaking up of the pattern. The breaking-up of the pattern may result in lines of one direction migrating while those intersecting therewith at 90° do not migrate. If both line directions do initiate, they then break away from the intersection of two intersecting lines, and the intersection migrates independently as square droplets. The end result is a discontinuous p-doped region which is not suitable for semiconductor device applications.

The feasibility of achieving uniform initiation and substantially straight uniform doped trails when thermally migrating fine lines of aluminum in silicon has been accomplished and is described in U.S. patent application, Ser. No. 942,123 entitled "Straight, Uniform Thermal Migration of Fine Lines" (Houston, Anthony and Cline) filed concurrently with this application and assigned to the same assignee. Preferably, this is accomplished by migrating a melt in $<100>$ material by TGZM processing with the thermal gradient directed slightly off-axis. One of the advancing {111} faces is then at a higher average temperature than the others. Dissolution proceeds preferentially at the hotter face and provides stability to the advancing liquid.

Although these recent findings open up new applications for the TZGM process, there are further applications requiring cross-hatched patterns. One means of getting around the problem of such patterns breaking up would be to perform two sequential straight line migrations at 90° with respect to each other. This, however, not only requires twice the time in the TGZM apparatus, but also requires two aluminum, or other suitable metal, evaporations, and two photolithography operations. This repetition of processing steps adds to the cost and cuts down on the yield.

Therefore, it is an object of this invention to provide a new and improved method for fabricating grid patterns in a matrix body of semiconductor material wherein each line wire of the grid is $\leq 0.002''$ in width.

Another object of this invention is to provide a method for migrating a grid pattern, wherein in each line wire is $\leq 0.002''$ in width, through a matrix body of semiconductor material by thermal gradient zone melting.

Other objects of this invention will, in part, be obvious and will, in part, appear hereinafter.

BRIEF DESCRIPTION OF THE INVENTION

In accordance with the teachings of this invention there is provided a new and improved method for migrating at least two intersecting molten metal wires of 2 mils or less in width through a solid matrix body of semiconductor material. The improvement in the method consists of establishing and maintaining a unidirectional thermal gradient between the two opposed major surfaces at from 2° to 10° off-axis of the normally preferred crystal axis of thermal migration. The matrix body has a preferred major surface of (100) planar crystal orientation in which initation of melt migration commences. The unidirectional thermal gradient is established and maintained in the body in a direction which is off the $<100>$ crystal axis of the matrix body toward a crystal axis direction which is one selected from the group consisting of $<01\bar{1}>$ and $<0\bar{1}1>$. A method of achieving this off-axis thermal gradient is to cut the matrix bodies off-axis in a manner whereby the crystal axis of rotation for cutting the body is one selected from the group consisting of $<001>$ and $<010>$.

This improvement in practicing thermal gradient zone melting enables one to simultaneously migrate all intersecting fine metal lines of 2 mils or less in width, even when arranged in a cross-hatched pattern. The improvement results from the substantially simultaneous initiation of each line along its entire length, as well as the intersecting portion of each pair of intersecting lines.

DESCRIPTION OF THE INVENTION

A matrix body of semiconductor material is selected for a particular level of resistivity and a first type conductivity. The body has opposed major surfaces which are the top and bottom surfaces respectively thereof. The semiconductor material comprising the body may be silicon, germanium, silicon carbide, gallium arsenide, a compound of a Group II element and a Group VI element, and a compound of a Group III and a Group IV element.

An off-axis thermal gradient can be utilized to initiate and migrate a pattern of fine liquid wires through a solid matrix body of semiconductor material. The stability of the migrating fine liquid wires during migration is maintained. The pattern is a grid-like configuration of one array of wires intersecting a second array of wires at an angle of 90° with respect to each other. The configuration in essence is a cross-hatched pattern. Each wire line is <0.002" in width.

Although it did not appear pertinent at first, the teachings of Anthony and Cline in "Random Walk of Liquid Droplets Migrating in Silicon," *Journal of Applied Physics*, 47, 2316 (1976) was reviewed and it was discovered that in a similar relationship of the off-axis thermal gradient relative to migrating droplets through a solid body, the same principles could be made to apply to migrating the pattern of fine liquid wires. The thermal gradient is established at from 2° to 10° off the preferred crystal axis of migration shown in the table. I discovered that all the fine metal wires of the pattern initiated uniformly, and together, and stably migrated through the solid body. Thus, it has been established that preferential dissolution is being practiced at one of the forward faces of the migrating molten wire as it is always at a higher average temperature than the other faces of the migrating wires. The off-axis thermal gradient prevents the random dislocation-induced sideways displacements which are observed when the thermal gradient is parallel to the preferred crystal axis of migration. Therefore, a steady non-random displacement of the migrating molten wires in a direction dictated by the slightly off-axis thermal gradient is successfully achieved and results in the pattern array of fine lines of 2 mils in width and less.

Although the off-axis thermal gradient is applied to any of the preferred wafer planar orientations disclosed heretofore in the prior art wherein stable wire directions will produce the desired grid pattern, I prefer to utilize wafers having a (100) planar crystal orientation and a <100> preferred crystal axis of migration. In U.S. Pat. No. 3,998,662 entitled "Migration of Fine Lines For Bodies of Semiconductor Materials Having A (100) Planar Orientation of A Major Surface," I, along with my coinventors of that patent, teach that with a wafer of (100) planar orientation, the molten wires tend to be self-initiating in migrating thermally and as a result less sideways displacement occurs. Consequently, the width of the migrating wire remains almost the same width as the deposited layer of metal whereas in the (111) planar orientation the recrystallized regions produced have a tendency to be greater in width than the wires deposited.

Maximum stability for migrating a pattern of straight parallel wire lines is achieved by aligning the pattern or array along the <011> crystal axis with a sideways component of the thermal gradient in the <011> direction from the <100> axis. However, I have discovered that in migrating my cross-hatched pattern of lines, maximum stability of the migrating cross-hatched pattern of liquid wires is achieved by having the off-axis component of the thermal gradient in either the <010> or the <001> direction. The wire directions are parallel to the <011> and <01$\bar{1}$> crystal axes respectively.

The off-axis thermal gradient can be obtained most easily by <100> wafers which are deliberately cut off-axis. The wafers are cut in a manner so that as required the thermal gradient is unidirectionally established in the wafer in a direction off the <100> crystal axis toward a crystal axis direction which is selected from the group consisting of <01$\bar{1}$> and <0$\bar{1}$1>. The off-axis component of the thermal gradient is preferably from 2° to 10°. Below 2°, the results achieved are essentially the same as achieved in the prior art. When greater than 10° off-axis the migrating liquid wires begin to become unstable.

The thermal gradient is established perpendicular to the major opposed surfaces of the wafer. The off-axis sideways component is directed at 45° with respect to the stable wire line directions. This orientation of the stable wire lines results in preferential dissolution for one face of both line directions equally as well during migration.

The cross-hatched pattern of array of fine liquid wires migrates in the <100> direction with the {111} faces of each line being the face where dissolution occurs as the line advances through the matrix body. With the off-axis component of the thermal gradient, each migrating line has a {111} face which will be at a higher temperature than the other {111} face of the respective line and will therefore dissolve preferentially before the other face will dissolve. The two perpendicular faces of the intersecting liquid wires initiate migration substantially on one major surface and simultaneously migrate stably through the matrix body to the other opposed major surface. Therefore, in addition to providing simultaneous initiation of the intersecting liquid wire lines, the migrating liquid wire lines have substantial immunity to the effects of dislocation during migration by thermal gradient zone melting.

The surface of the body of semiconductor material is prepared by usual semiconductor processing techniques for deposition of the metal to be migrated through the solid body of material. The metal may be deposited by any suitable means on the surface of initiation of melt migration. For example, when the body is of N-type silicon semiconductor material and the melt to be migrated comprises, at least in part, aluminum, it has been discovered that the vapor deposition of the layer of aluminum metal should be performed at a pressure of approximately $1 \times 10^{-5}$ torr but not greater than $5 \times 10^{-5}$ torr. When the pressure is greater than $5 \times 10^{-5}$ torr, it has been found that in the case of aluminum metal vapor deposited, the aluminum does not easily penetrate into the silicon and migrate through the body. It is believed that the layer of aluminum is saturated with oxygen and prevents reduction by the aluminum metal of the very thin silicon oxide layer between the deposited aluminum and the silicon. Thus, the initial melt of aluminum and silicon required for migration is not obtained because of the inability of the aluminum layer to wet and alloy with the underlaying silicon. In a similar manner, the aluminum deposited by sputtering is not as desirable as sputtered aluminum appears to be saturated with oxygen from the sputtering process, thereby preventing the reduction of any intervening silicon oxide. The preferred methods of depositing aluminum on the silicon body are by the electron beam method and the like wherein little, if any, oxygen can be trapped in the aluminum. The aluminum may be deposited directly onto the surface and patterned. No oxide mesh or etched pits are required to aid initiation of the melt.

The processed body is then placed in suitable apparatus for practicing thermal gradient zone melting. The temperature gradient zone melting process and apparatus is not a part of this invention. For a more thorough understanding of the temperature gradient zone melting process employed in this invention and for a more thorough description of the apparatus employed for this process, one is directed to the following U.S. Patents entitled Method of Making Deep Diodes, U.S. Pat. No. 3,901,736; Deep Diode Devices and Method and Apparatus, U.S. Pat. No. 4,075,038; High Velocity Thermomigration Method of Making Deep Diodes, U.S. Pat. No. 3,898,106; Deep Diode Device and Method, U.S. Pat. No. 3,902,925; The Stabilized Droplet Method of Making Deep Diodes Having Uniform Electrical Properties, U.S. Pat. No. 3,899,361; Isolation Junctions With Semiconductor Devices, U.S. Pat. No. 3,988,763—and Thermomigration of Metal-Rich Liquid Wires Through Semiconductor Materials U.S. Pat. No. 3,899,362.

The improved method of TGZM processing of this invention is adaptable for migrating two or more intersecting lines as well wherein the width of each intersecting line is 2 mils or less.

I claim as my invention:

1. In the method of moving a melt of metal-rich semiconductor material in the configuration of at least two intersecting wire lines of no greater than 2 mils in width through a solid body of semiconductor material by thermal gradient zone melting processing comprising the steps of
    selecting a matrix body of single crystal semiconductor material so that the body has a first type conductivity, a selected resistivity, and at least one major surface having a preferred planar crystal structure orientation of (100), the vertical axis of the body being substantially aligned with a first axis of the crystal structure;
    preparing the surface having the preferred planar crystal structure orientation to accommodate one or more physical configurations of a layer of metal thereon;
    depositing a layer of a metal on the selected surface of the body of semiconductor material;
    heating the body and the metal to a temperature sufficient to form a melt of metal-rich material on the surface of the body;
    establishing a temperature gradient along substantially the vertical axis of the body and the first axis of the crystal structure; p1 migrating the metal-rich melt through the body along the first axis of the crystal structure to divide the body into a plurality of regions of first type conductivity and to form at least one array of regions of recrystallized material of the body having solid solubility of the vapor deposited metal therein, the metal including at least one dopant impurity material therein to impart a second and opposite type conductivity and a selected level of resistivity thereto,
then improvement in the method of processing which includes
    orienting the at least two intersecting wire lines in a preferred crystal axis direction which is parallel to <011> for one wire line and <01$\bar{1}$> for the other line, and
    establishing the unidirectional thermal gradient at from 2° to 10° off the crystal axis of migration.

2. The method of claim 1 including
    cutting the matrix body of semiconductor material off-axis wherein the crystal axis of rotation is one selected from the group consisting of <001> and <010>.

3. The method of claim 1 or 2 wherein
    the configuration is a cross-hatched pattern of intersecting lines consisting of
    one array of fine wire lines of the pattern aligned parallel to each other and the <011> axis, and
    a second array of fine wire lines aligned parallel to each other and the <01$\bar{1}$> axis and intersecting lines of the first array.

4. The method of claims 1 or 2 wherein
    the matrix body is silicon, and
    the metal of the wire is aluminum.

5. The method of claim 3 wherein
    the matrix body is silicon, and
    the metal of the wire is aluminum.

* * * * *